US007142052B2

(12) United States Patent
Zelley

(10) Patent No.: US 7,142,052 B2
(45) Date of Patent: Nov. 28, 2006

(54) TRAVELLING WAVE AMPLIFIERS

(75) Inventor: Christopher Andrew Zelley, Lower Wick (GB)

(73) Assignee: Qinetiq Limited (GB)

( * ) Notice: Subject to any disclaimer, the term of this patent is extended or adjusted under 35 U.S.C. 154(b) by 0 days.

(21) Appl. No.: 10/472,787

(22) PCT Filed: Mar. 27, 2002

(86) PCT No.: PCT/GB02/01432

§ 371 (c)(1),
(2), (4) Date: Sep. 24, 2003

(87) PCT Pub. No.: WO02/078180

PCT Pub. Date: Oct. 3, 2002

(65) Prior Publication Data

US 2004/0130390 A1    Jul. 8, 2004

(30) Foreign Application Priority Data

Mar. 27, 2001    (GB) .................................. 0107560.5

(51) Int. Cl.
*H03F 3/58* (2006.01)
(52) U.S. Cl. .......................... 330/43; 315/3.5; 315/3.6
(58) Field of Classification Search .................. 330/43, 330/53, 54, 124 R, 286, 295, 98, 133, 150, 330/310
See application file for complete search history.

(56) References Cited

U.S. PATENT DOCUMENTS

| 4,543,535 A | * | 9/1985 | Ayasli .......................... 330/53 |
| 4,752,746 A | * | 6/1988 | Niclas ......................... 330/286 |
| 4,772,858 A | * | 9/1988 | Tsukii et al. .................. 330/54 |
| 4,797,628 A | * | 1/1989 | Gruchalla et al. ............. 330/54 |
| 4,947,136 A |   | 8/1990 | Helms .......................... 330/54 |
| 4,967,162 A | * | 10/1990 | Barnett et al. ................ 330/43 |
| 5,414,387 A |   | 5/1995 | Nakahara ...................... 330/54 |
| 5,485,118 A | * | 1/1996 | Chick .......................... 330/295 |
| 5,654,670 A |   | 8/1997 | Lange .......................... 330/54 |
| 5,751,190 A | * | 5/1998 | Nguyen et al. ................ 330/54 |
| 5,920,230 A |   | 7/1999 | Beall .......................... 330/54 |
| 6,396,349 B1 | * | 5/2002 | Takei et al. ................. 330/286 |
| 6,566,956 B1 | * | 5/2003 | Ohnishi et al. .............. 330/295 |

OTHER PUBLICATIONS

Kobayashi, et al. "A Monolithic DC Temperature Compensation Bias Scheme for Multistage HEMT Integrated Circuits", IEEE Transactions on Microwave Theory and Techniques, pp. 261-268 (1996).

* cited by examiner

*Primary Examiner*—Khanh Van Nguyen
(74) *Attorney, Agent, or Firm*—McDonnell Boehnen Hulbert & Berghoff LLP

(57)    ABSTRACT

A traveling wave amplifier (TWA) comprising two or more amplification modules, the inputs of adjacent amplification modules being connected together by a first inductance component of a first characteristic impedance, a second inductance component of a second characteristic impedance and a third inductance component of substantially the first characteristic impedance, the first characteristic impedance being greater than the second characteristic impedance. The outputs of adjacent modules may be similarly connected together by first, second and third inductance components. The characteristic impedance of the second inductance components is preferably substantially equal to that of the circuits to which the TWA is connected, e.g. 50Ω. The first and third inductance components have a characteristic of 100Ω. Such a TWA allows balancing of phase velocities between inputs and outputs of the amplification modules, connection of these around via holes, and extends the frequency capability of the TWA.

18 Claims, 1 Drawing Sheet

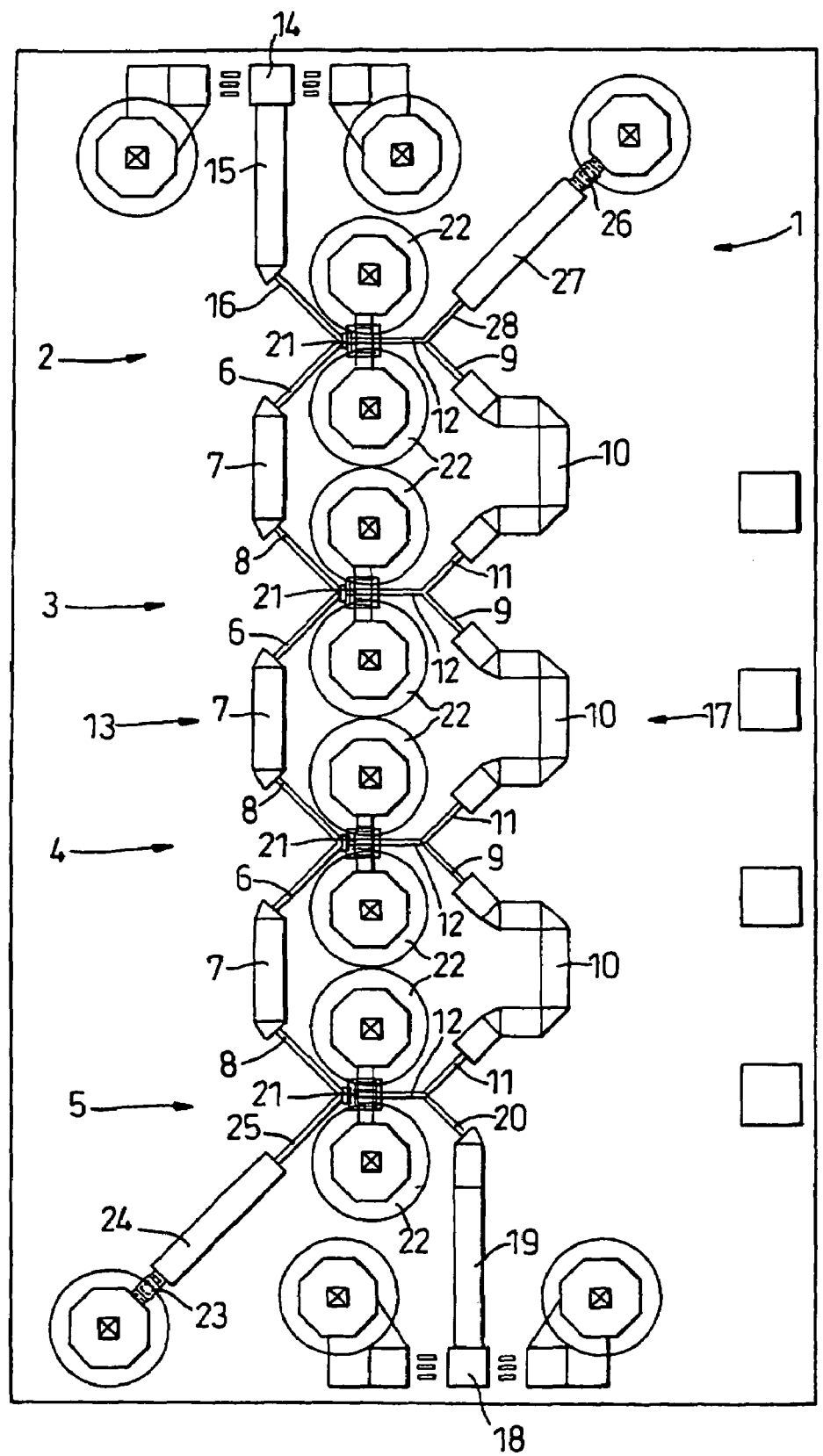

TRAVELLING WAVE AMPLIFIERS

BACKGROUND OF THE INVENTION

1. Field of the Invention

This invention relates to improvements in travelling wave amplifiers (TWAs), and particularly millimeter wave travelling wave amplifiers.

2. Description of Related Art

Travelling waves are electromagnetic waves that travel along and are guided by a transmission line. If amplification of travelling waves is required, then it is desirable to use an amplifier which acts as a transmission line. Such travelling wave amplifiers (or distributed amplifiers) are known. These generally comprise two or more amplification modules connected together. The input and the output of each amplification module forms a so-called artificial transmission line. Each artificial transmission line includes series inductance components and shunt capacitance. The inductance components can be realised using high impedance transmission lines. The capacitance can be the parasitic capacitance associated with each amplification module. The characteristic impedance of the artificial transmission line is then given by $Z_0 = \text{Sqrt}(L/C)$, i.e. is not frequency dependent, a desirable characteristic for TWAs. In addition, by careful choice of the values of the inductance and the capacitance, the characteristic impedance can be set at approximately 50Ω, the industry standard in TWA applications. The amplification modules are connected together by connecting together inductance components of each module. The inductance components used have high characteristic impedance, in the region of 100Ω.

The cut-off frequency of each amplification module of a TWA is related to the inductance and capacitance of the input and output artificial transmission lines thereof. The cut-off frequency is inversely proportional to the square root of the product of the inductance and capacitance. In order to increase the cut-off frequency, the inductance and capacitance can be reduced. To reduce the inductance t the length of the inductance components of each artificial transmission line may be reduced. However, this can result in a number of problems. For example, each amplification module has a finite size. If the length of the inductance components are reduced they may no longer be of sufficient size to connect the modules together. This may be particularly so in millimeter wave applications (i.e. high frequency applications), where the minimum separation between amplification modules may be longer than the required length of the inductance components used to connect them together.

Another problem with many TWAs arises because of unequal phase velocities in the input and the output artificial transmission lines of each amplification module. When it is desired to combine the amplified signal from each module such unequal phase velocities can result in some cancelling in the overall output signal. This problem can be overcome by making the electrical length of the inductance components in the output artificial transmission line of each module equal to the electrical length of the inductance components in the input artificial transmission line. However, increasing the length of the inductance components in the output artificial transmission line may have an adverse effect on the desired cut-off frequency and return loss.

BRIEF SUMMARY OF THE INVENTION

According to the invention there is provided a travelling wave amplifier comprising two or more amplification modules, wherein the inputs of adjacent amplification modules are connected together by a first inductance component of a first characteristic impedance, a second inductance component of a second characteristic impedance and a third inductance component of substantially the first characteristic impedance, the first characteristic impedance being greater than the second characteristic impedance.

The outputs of adjacent amplification modules may be connected together by a first inductance component of a first characteristic impedance, a second inductance component of a second characteristic impedance and a third inductance component of substantially the first characteristic impedance, the first characteristic impedance being greater than the second characteristic impedance.

The output of each amplification module may be provided with an output inductance component. This may connect the module to the first, second and third inductance components. The characteristic impedance of the output inductance component may be substantially equal to the characteristic impedance of the first and third inductance components.

The characteristic impedance of the second inductance component connecting either the input or the output of adjacent amplification modules is preferably substantially equal to the characteristic impedance of the input and output circuits to which the TWA is connected for use. Preferably, the characteristic impedance of the second inductance component or components is substantially 50Ω. This is the industry standard for travelling wave applications, and circuits such as TWAs and the circuits to which they are connected are generally constructed such that they have a characteristic impedance of substantially 50Ω. Of course, the characteristic impedance of the second inductance component or components could be other than 50Ω, for example 40Ω or 30Ω. The first and third inductance components may have a characteristic impedance of substantially 80Ω or 100Ω or 120Ω or higher.

Addition of the second inductance component allows the connection between either the input or the output of adjacent amplification modules to be of sufficient length to reach between the modules, even in high frequency applications. It has been found that using a second, lower characteristic impedance inductance component in the connection between either the input or the output of adjacent amplification modules has no significant adverse effect on the performance of the TWA.

The second inductance component connecting either the input or the output of adjacent amplification modules preferably comprises a transmission line. The transmission line may be a microstrip transmission line. The microstrip transmission line may be formed from a metallic, e.g. gold alloy, track.

The first and third inductance components connecting either the input or the output of adjacent amplification modules may each comprise an inductor or a transmission line. The transmission lines may be a microstrip transmission lines. The microstrip transmission lines may be formed from metallic, e.g. gold alloy, tracks.

Each of the inductance components connecting the inputs of the amplification modules may make up part of a common input line. The common input line may be connected to a single input port of the TWA. A part of a signal input into the TWA is thus conveyed to each amplification module where it is amplified. Each of the inductance components connecting the outputs of the amplification modules may make up part of a common output line. The common output line may be connected to a single output port of the TWA. Thus the output signal from each amplification module may be combined to give a TWA output signal, output via the common output line through the common output port.

When it is desired to combine the output signal from each amplification module giving a TWA output signal, it is obviously desirable that the signals from the modules should have substantially the same phase. Otherwise, on combination of the signals, some cancellation and therefore loss of TWA signal will occur. The length of the second inductance component connecting the outputs of a pair of adjacent amplification modules may be greater than the length of the second inductance component connecting the inputs of the pair of adjacent amplification modules. This can be used to overcome any inequality in the phase velocities between the input and the output lines, which can occur for a number of types of TWA. It has been found that using a longer second inductance component in the connection between the outputs of adjacent amplification modules has no significant adverse effect on the performance of the TWA.

The common input line of the TWA may be provided with one or more terminating elements such as resistors. Preferably, a resistor is placed in the common input line adjacent to the last amplification module in the line. The common output line of the TWA may be provided with one or more terminating elements such as resistors. Preferably, a resistor is placed in the common output line adjacent to the first amplification module in the line. As it is desired to increase the operating frequency of a TWA, the length of the inductance components making up the common input and output lines becomes smaller. The terminating resistors are then placed closer and closer to the amplification modules connected to the lines, which can give rise to unwanted coupling between them. The common input line of the TWA may comprise one or more inductance components placed to space the resistors from the amplification modules connected to the line. For example, an inductance component may be placed between the last amplification module connected to the line and a resistor. The common output line of the TWA may comprise one or more inductance components placed to space the resistors from the amplification modules connected to the line. For example, an inductance component may be placed between the first amplification module connected to the line and a resistor. Thus the resistors are moved away from the amplification modules, and the possibility of coupling reduced. The inductance components preferably have a characteristic impedance substantially equal to the characteristic impedance of the input and output circuits to which the TWA is connected for use. Preferably, the characteristic impedance of each inductance component is substantially 50Ω. It has been found that the addition of such inductance components has no significant adverse effect on the performance of the TWA.

Each of the amplification modules preferably has a characteristic impedance substantially equal to the characteristic impedance of the input and output circuits to which the TWA is connected for use. Preferably, the characteristic impedance of each module is substantially 50Ω. As above, this is the industry standard for travelling wave applications.

Each amplification module and at least some of the inductance components connected between the inputs and/or the outputs thereof preferably provide transmission lines for signals input into the TWA and for signals output from the TWA. In particular, each amplification module may be connected at its input to two inductance components. One of the inductance components may comprise the third inductance component by which a first amplification module is connected to a second amplification module, and the other inductance component may comprise the first inductance component by which the second amplification module is connected to a third amplification module. Similarly, each amplification module may be connected at its output to two inductance components. Again, one of the inductance components may comprise the third inductance component by which a first amplification module is connected to a second amplification module, and the other inductor may comprise the first inductor by which the second amplifier module is connected to a third amplifier module. Each amplification module may provide one or more capacitances. Each amplification module preferably provides a capacitance at its input and a capacitance at its output. Each amplification module input capacitance is preferably a shunt capacitance and connected to the two inductance components connected to the input of the amplification module. The inductance components are preferably in series with each other. The series inductance components and shunt capacitance may act to provide a transmission line for signals input to the amplification module. Similarly, each amplification module output capacitance is preferably a shunt capacitance and connected to the two inductance components connected to the output of the amplification module. The inductance components are preferably in series with each other. The series inductance components and shunt capacitance may act to provide a transmission line for signals output from the amplification module.

Each amplifier module may comprise one or more transistors. These may be, for example, field effect transistors (FETs) or bipolar transistors, or a combination thereof. When an amplification module comprises one or more FETs, each of these may be provided with one or more vias to connect the FET to ground. The connections between the FETs will have to be of such length to be able to reach around the vias. Addition of the second, lower characteristic impedance inductance components in the input and output lines allows such connection.

When an amplification module comprises an FET, the input capacitance of the module may be provided by the parasitic capacitance between the gate and the source of the FET, and the output capacitance of the module may be provided by the parasitic capacitance between the drain and the source of the FET.

The TWA may be a microwave monolithic integrated circuit (MMIC) TWA. The TWA is preferably capable of amplification of signals having wavelengths in the millimeter range. The TWA is preferably capable of amplification of signals having frequencies in at least the range of substantially 100 kHz to substantially 50 GHz, or higher or lower. Thus the TWA of the invention extends the upper operating frequency of TWAs in general. The gain of the TWA is preferably approximately 10 dB, or higher or lower, preferably over the whole of the frequency range the TWA operates in.

BRIEF DESCRIPTION OF THE VIEW OF THE DRAWING

The invention will now be described by way of example only with reference to the accompanying drawing which shows a circuit diagram of a TWA according to the invention.

DETAILED DESCRIPTION OF THE INVENTION

The travelling wave amplifier 1 is a MMIC TWA, and comprises four amplification modules 2, 3, 4 and 5. The bias circuitry has been omitted for clarity. The inputs of modules 2 and 3, modules 3 and 4, and modules 4 and 5 are connected together by a first inductance component 6, a second inductance component 7 and a third inductance component 8. The outputs of amplification modules 2 and 3, modules 3 and 4, and modules 4 and 5 are connected together by a first inductance component 9, a second inductance component 10 and a third inductance component 11. The outputs of each module are provided with inductance components 12, which connect them to the inductance components 9, 10 and 11.

The inductance components 6 to 12 each comprise microstrip transmission lines. These are formed from gold alloy tracks. The characteristic impedance of transmission lines 7 and 10 is substantially equal to the characteristic impedance of the input and output circuits to which the TWA is connected for use, in this case substantially 50Ω, the industry standard for TWAs and the circuits to which they are connected. The characteristic impedance of transmission lines 6, 8, 9, 11 and 12 is substantially 100Ω.

Each of the transmission lines 6, 7 and 8 connecting the inputs of the amplification modules make up part of a common input line 13. This is connected to a single input port 14 of the TWA, via a 50Ω transmission line 15 and a 100Ω transmission line 16. A part of a signal input into the TWA is thus conveyed to each amplification module where it is amplified.

Each of the transmission lines 9, 10, 11 and 12 connecting the outputs of the amplification modules make up part of a common output line 17. This is connected to a single output port of the TWA 18 via a 50Ω transmission line 19 and a 100Ω transmission line 20. Thus the output signal from each amplification module is combined to give a TWA output signal, output via the common output port 18.

The inductance components 15, 16, 19 and 20 comprise microstrip transmission lines. These are also formed from gold alloy tracks.

Each of the amplification modules has a characteristic impedance substantially equal to the characteristic impedance of the input and output circuits to which the TWA is connected for use, in this case substantially 50Ω. As can be seen, each amplification module is connected at its input to two transmission lines, together with which it forms a 50Ω transmission line. Similarly, each amplification module is connected at its output to two transmission lines, via transmission lines 12, together with which it forms a 50Ω transmission line.

Each amplification module comprises an FET 21 provided with two vias 22 to connect the FET to ground. The parasitic capacitance between the gate and the source of the FET provides a capacitance at the input of each module. Similarly, the parasitic capacitance between the drain and the source of the FET provides a capacitance at the output of each module. Each amplification module input capacitance is a shunt capacitance and is connected to the two transmission lines connected to the input of the amplification module, which transmission lines are in series with each other. The series transmission lines and shunt capacitance act to provide a 50Ω transmission line for signals input to the amplification module. Similarly, each amplification module output capacitance is a shunt capacitance and is connected via the transmission lines 12 to the two transmission lines connected to the output of the amplification module, which two transmission lines are in series with each other. The series transmission lines and shunt capacitance act to provide a 50Ω transmission line for signals output from the amplification module.

The TWA 1 is capable of amplification of signals having wavelengths in the millimeter range. The TWA is capable of amplification of signals having frequencies in the range of substantially 100 kHz to substantially 50 GHz. The gain of the TWA is approximately 10 dB, over the whole of the frequency range the TWA operates in.

Addition of the lower characteristic impedance transmission lines 7 and 10 allows the connections between the inputs and the outputs of adjacent amplification modules to be of sufficient length to reach between the modules, and particularly to reach around the vias 22. It has been found that using the transmission lines 7, 10 in the connections between either the input or the output of adjacent amplification modules has no significant adverse effect on the performance of the TWA.

When combining the output signal from each amplification module to give a TWA output signal, it is obviously desirable that the signals from the modules should have substantially the same phase. Otherwise, on combination of the signals, some cancellation and therefore loss of TWA signal will occur. The length of the transmission line 10 connecting the outputs of a pair of adjacent amplification modules is made greater than the length of the transmission line 7 connecting the inputs of the pair of adjacent amplification modules. This overcomes inequality in the phase velocities between the input and the output lines which arise because the parasitic capacitance between the gate and the source of the FET of each module is greater than that between the drain and the source. It has been found that using such a longer transmission line in the connection between the outputs of adjacent amplification modules has no significant adverse effect on the performance of the TWA.

The common input line 13 of the TWA is provided with a resistor 23, placed adjacent to the last amplification module 5 in the line, and connected to this by a 50Ω transmission line 24 and a 100Ω transmission line 25. The common output line 17 of the TWA is similarly provided with a resistor 26, placed adjacent to the first amplification module 2 in the line, and connected to this by a 50Ω transmission line 27 and a 100Ω transmission line 28 each made of gold alloy. The resistors 23, 26 function to terminate these lines. The transmission lines 24 and 27 are used to move the resistors 23, 26 away from the amplification modules, and hence reduce the possibility of coupling between the amplification modules and the resistors. It has been found that the addition of such transmission lines has no significant adverse effect on the performance of the TWA.

The invention claimed is:

1. A travelling wave amplifier (TWA) comprising two or more amplification modules wherein the inputs of adjacent amplification modules are connected together by first, second and third lengths of transmission line, the first and third lengths of transmission line having a first inductance per unit length and the second length of transmission line having a second inductance per unit length different to the first inductance per unit length, said first, second and third lengths of transmission line being arranged in series with the second length being disposed between the first and the third lengths and form part of a common input line of the TWA.

2. A TWA according to claim 1 in which the outputs of adjacent amplification modules are connected together by first, second and third lengths of transmission line, the first and third lengths of transmission line having a first inductance per unit length and the second length of transmission line having a second inductance per unit length different to the first inductance per unit length, said first, second and third lengths of transmission line being arranged in series with the second length being disposed between the first and the third lengths and form part of a common output line of the TWA.

3. A TWA according to claim 2 in which the output of each amplification module is provided with an output inductance component.

4. A TWA according to claim 3 in which the output inductance component connects the amplification module to the first, second and third lengths of transmission line.

5. A TWA according to claim 3 in which the characteristic impedance of each output inductance component is substantially equal to the characteristic impedance of the first and third lengths of transmission line.

6. A TWA according to claim 1 in which the characteristic impedance of the second length of transmission line connecting either the input or the output of adjacent amplification modules is substantially equal to the characteristic impedance of input and output circuits to which the TWA is connected.

7. A TWA according to claim 1 in which the characteristic impedance of the second length of transmission line is substantially 50Ω.

8. A TWA according to claim 1 in which the first and third lengths of transmission line preferably have a characteristic impedance of substantially 100Ω.

9. A TWA according to claim 1 in which the second length of transmission line connecting either the input or the output of adjacent amplification modules are each lengths of microstrip transmission line.

10. A TWA according to claim 1 in which the first and third lengths of transmission line connecting either the input or the output of adjacent amplification modules are each lengths of microstrip transmission line.

11. A TWA according to claim 1 in which the common input line is connected to a single input port of the TWA.

12. A TWA according to claim 2 in which the common output line is connected to a single output port of the TWA.

13. A TWA according to claim 2 in which the length of the second length of transmission line connecting the outputs of a pair of adjacent amplification modules is greater than the length of the second length of transmission line connecting the inputs of the pair of adjacent amplification modules.

14. A TWA according to claim 1 in which the common input line of the TWA is provided with one or more resistors.

15. A TWA according to claim 14 in which the common input line of the TWA comprises one or more inductance components placed to space the resistors from the amplification modules connected to the common input line.

16. A TWA according to claim 2 in which the common output line of the TWA is provided with one or more resistors.

17. A TWA according to claim 16 in which the common output line of the TWA comprises one or more inductance components placed to space the resistors from the amplification modules connected to the common output line.

18. A TWA according to claim 1 in which each amplification module provides one or more capacitances.

* * * * *